US 6,368,137 B1

(12) United States Patent
Orwoll

(10) Patent No.: US 6,368,137 B1
(45) Date of Patent: Apr. 9, 2002

(54) VERTICALLY ACTUATED BGA SOCKET

(75) Inventor: Erik G. Orwoll, Phoenix, AZ (US)

(73) Assignee: Wells-CTI, Inc., Phoenix, AZ (US)

( * ) Notice: Subject to any disclaimer, the term of this patent is extended or adjusted under 35 U.S.C. 154(b) by 0 days.

(21) Appl. No.: 09/404,489

(22) Filed: Sep. 23, 1999

Related U.S. Application Data

(60) Provisional application No. 60/101,466, filed on Sep. 23, 1998.

(51) Int. Cl.[7] .............................................. H01R 13/62
(52) U.S. Cl. ....................................... 439/331; 439/342
(58) Field of Search .............................. 439/70, 71, 73, 439/259–268, 330, 331, 342

(56) References Cited

U.S. PATENT DOCUMENTS

| | | | |
|---|---|---|---|
| 4,407,555 A | | 10/1983 | Lockard ........................ 439/70 |
| 4,750,890 A | | 6/1988 | Dube et al. ................... 439/152 |
| 5,013,256 A | * | 5/1991 | Matsuoka et al. ............ 439/259 |
| 5,020,998 A | * | 6/1991 | Ikeya et al. .................. 439/266 |
| 5,037,321 A | * | 8/1991 | Uratsuji et al. .............. 439/342 |
| 5,213,531 A | * | 5/1993 | Matsuoka et al. ............ 439/331 |
| 5,228,866 A | | 7/1993 | Espenshade et al. ......... 439/266 |
| 5,273,441 A | | 12/1993 | Volz et al. ..................... 439/72 |
| 5,290,192 A | | 3/1994 | Espenshade et al. ......... 439/266 |
| 5,364,286 A | * | 11/1994 | Matsuoka ..................... 439/331 |
| 5,482,471 A | * | 1/1996 | Mori et al. ................... 439/331 |
| 5,489,218 A | * | 2/1996 | McHugh ...................... 439/342 |
| 5,578,870 A | | 11/1996 | Farnsworth et al. ......... 257/727 |
| 5,646,447 A | | 7/1997 | Ramsey et al. .............. 257/727 |
| 5,688,140 A | * | 11/1997 | McHugh et al. ............. 439/342 |
| 5,731,709 A | | 3/1998 | Pastore et al. ............... 424/760 |
| 6,106,319 A | * | 8/2000 | Fukunaga et al. ............ 439/331 |

* cited by examiner

Primary Examiner—Hien Vu
(74) Attorney, Agent, or Firm—Baker & Daniels

(57) ABSTRACT

A chip carrying socket includes a base and at least one and preferably two cam shafts journaled or supported within the base in a spaced relationship for rotational movement relative to the base. A plate is supported upon the base and extends between the cam shafts. The plate has a plurality of openings formed therein which receive the leads of an IC. In a BGA type IC, these leads are semi-spherical balls which depend from the lower face of the IC. Conductors or pins adapted for connection to testing or operative circuitry are carried by the base and extend into proximity with the leads of the IC as it is supported upon the plate. Each cam shaft engages the plate so as to shift the plate relative to the base causing the conductors carried by the base to forcibly engage the leads of the IC when in one shifted position and causing the conductors to be released from such forcible engagement with the leads of the IC when in a second shifted position. A top located over the base movable between upper and lower positions relative to the base and the underlying plate is provided. The top engages each of the cam shafts to rotate the shafts causing the plate to be shifted between its previously mentioned positions as the top is moved between its upper and lower positions. The top also releases a latch which holds the IC in place, as the top is moved to the lower position. In addition, adjustable locators which serve as a guide for the IC when it is placed upon the plate are provided and may be selectively positioned upon the plate depending upon the accommodating size of the IC and selected position of the IC upon the plate.

22 Claims, 7 Drawing Sheets

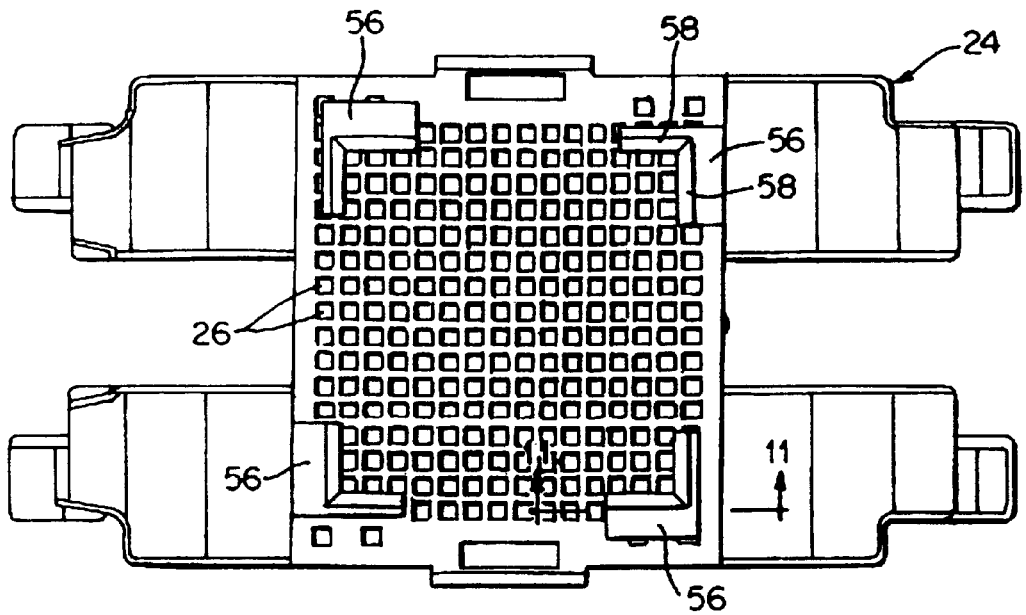
FIG. 9
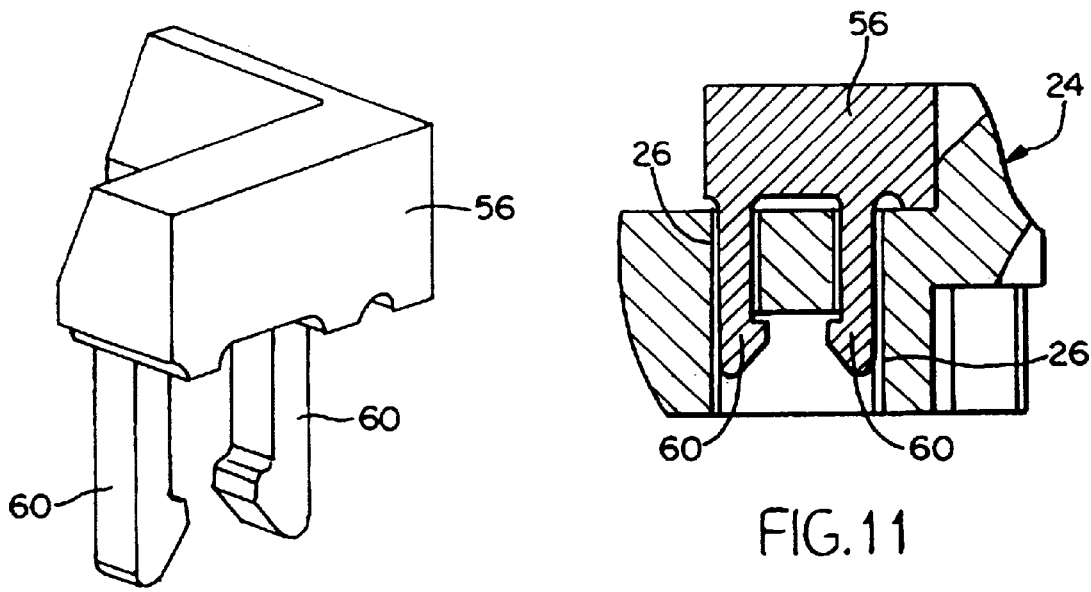
FIG. 10
FIG. 11

VERTICALLY ACTUATED BGA SOCKET

This application claims the benefit of provisional application No. 60/101,466, filed Sep. 23, 1998.

BACKGROUND OF THE INVENTION

This invention relates to a socket for retaining an integrated circuit (IC) for purposes of testing or application usage. While the type of IC shown and utilized in the following described embodiment is a ball grid array (BGA) type, it should be understood that other forms of ICs may be utilized.

There is a constant demand placed upon sockets requiring a reduction in overall size of the socket to accommodate reduced sizes of ICs. Further, the least number of components which form the socket the more reliable the operation and generally the less expensive the socket to produce. In this invention the socket includes a base and at least one and preferably two cam shafts journaled or supported within the base in a spaced relationship for rotational movement relative to the base. A plate is supported upon the base and extends between the cam shafts. The plate has a plurality of openings formed in it which receive the leads of the IC. In a BGA type IC, these leads are semi-spherical balls which depend from the lower face of the IC. Conductors or pins adapted for connection to testing or operative circuitry are carried by the base and extend into proximity with the leads of the IC as it is supported upon the plate. Each cam shaft engages the plate so as to shift the plate relative to the base causing the conductors carried by the base to forcibly engage the leads of the IC when in one shifted position and causing the conductors to be released from such forcible engagement with the leads of the IC when in a second shifted position. A top located over the base movable between upper and lower positions relative to the base and the underlying plate is provided. The top engages each of the cam shafts to rotate the shafts causing the plate to be shifted between its previously mentioned positions as the top is moved between its upper and lower positions. In addition, adjustable locators which serve as a guide for the IC when it is placed upon the plate are provided and may be selectively positioned upon the plate depending upon the accommodating size of the IC and selected position of the IC upon the plate.

BRIEF SUMMARY OF THE INVENTION

Accordingly it is an object of this invention to provide a socket device for an integrated circuit of reliable and simplified operation.

Another object of this invention is to provide a socket device for an integrated circuit which is of miniaturized design.

Still another object of this invention is to provide a socket device for a BGA type integrated circuit which is of economical design.

Other objects of this invention will become apparent upon a reading of the following description.

BRIEF DESCRIPTION OF THE DRAWINGS

A preferred embodiment has been chosen for illustrations and description wherein:

FIG. 9 is the top view of the shiftable plate of this invention showing the grid pattern openings and movable locating tabs.

FIG. 10 is a perspective view of a movable locating tab showing the mounting feet.

FIG. 11 is cross-sectional view of a mounting tab inserted into the shiftable plate.

DESCRIPTION OF THE PREFERRED EMBODIMENT

The preferred embodiment illustrated is not intended to be exhaustive or to limit the invention to the precise form disclosed. It is chosen and described in order best to explain the principles of the invention and its application and use.

Figure 1:
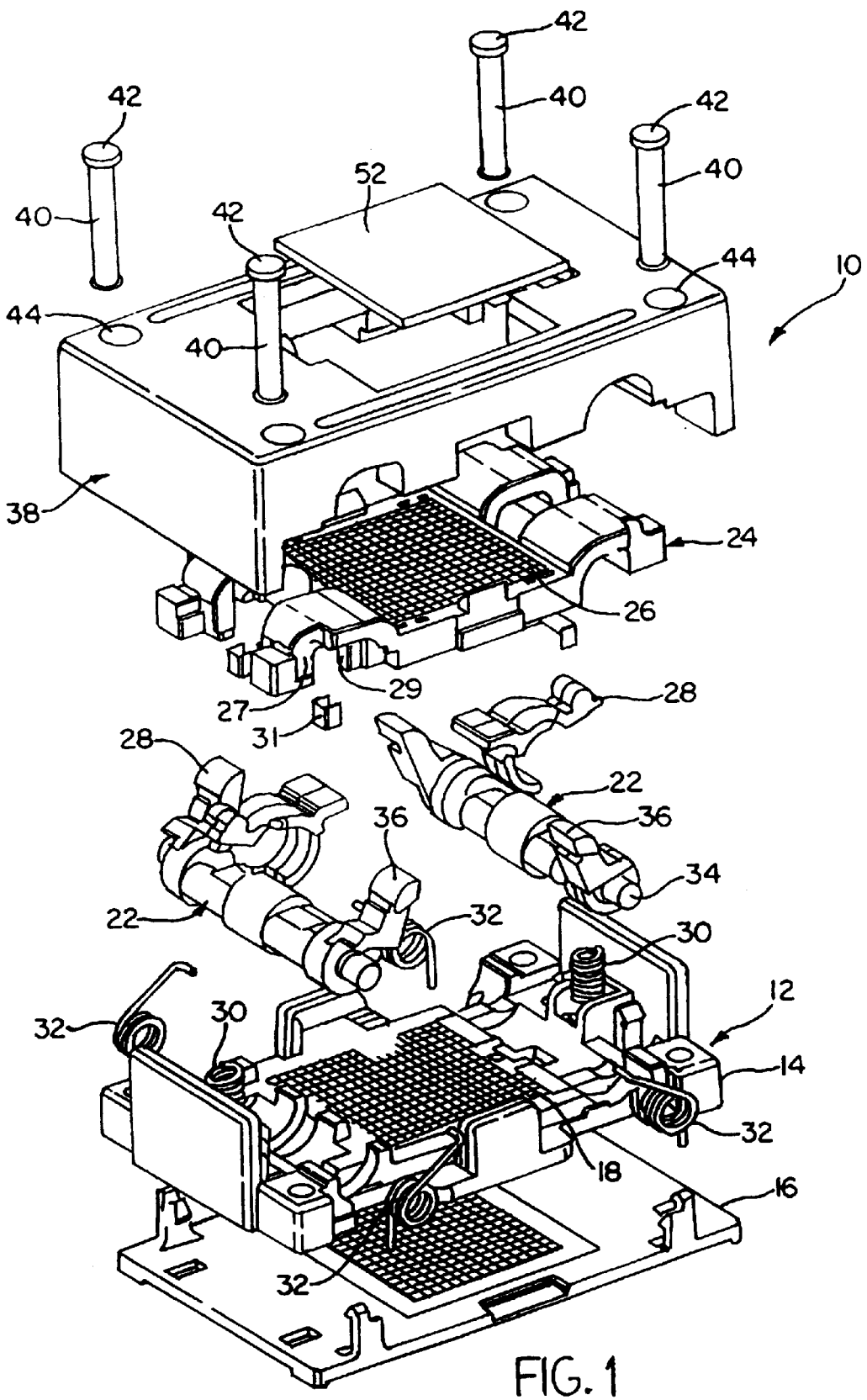
FIG. 1 is a perspective view of the component parts of the socket device shown in separated or exploded form for illustrative purposes.
Figure 12:
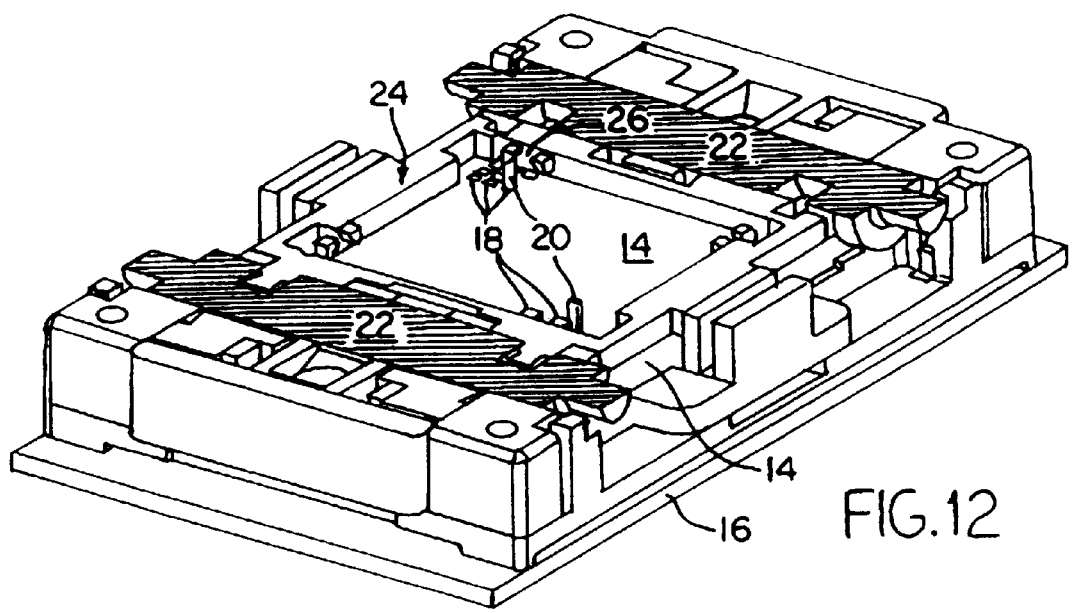
FIG. 12 is a perspective view of the base to the socket showing cross sections of the cams journaled therein.

Referring first to FIG. 1 in which the separated component parts of the socket device 10 are shown, there is a base 12 consisting of an upper base part 14 and a lower base part 16 which is snap-fitted onto upper base part 14. Upper base part 14 carries a center grid having a plurality of closely spaced openings 18, a plurality of conductors or pins 20 (see FIGS. 2–7, 12, 15 and 16) are anchored within upper base part 14 and extend upwardly through openings 18. Conductors or contacts 20 depend downwardly through lower base part 16. In FIG. 12, for simplification of illustration, the multiplicity of openings 18 in selected rows are not shown. For purposes of description, it is assumed that upper base part 14 has a conductor 20 extending through each of its openings 18. Each of the conductors or pins 20 may be connected to an appropriate testing or operational circuit.

Continuing to refer to FIG. 1, device 10 also includes two cam shafts 22 which are supported upon and journaled within upper base part 14 for rotational movement relative to base 12. A plate 24 is supported upon upper base part 14 overlying and flanked by cam shafts 22. Plate 24 is snap fitted at snaps 25 (FIG. 14, only two of four shown) to the base part so as to become a part of the base and to prevent its vertical separation while permitting horizontal movement of the plate relative to the base part. Plate 24 includes a center grid having a plurality of openings 26 (not shown in multiple form in FIG. 13 for simplification of illustration) which can be brought into alignment or registry with the openings 18 in upper base part 14. The upper distal end of each conductor or pin 20 extends upwardly into a registering opening 26 in plate 24. Conductor 20 extends preferably just to or slightly below the upper surface of plate 24. The shiftability of the plate and the general location of the conductor relative to the plate are shown in U.S. Pat. No. 5,646,447 incorporated herein by reference. Attached to or molded integrally with plate 24 are wall like sections 27 and 29, which reduce the cross section of the cam shaft journal area in plate 24. A metal tab 31 is provided to fit over wall like portion 29 for providing a bearing surface thereon.

Figure 3:
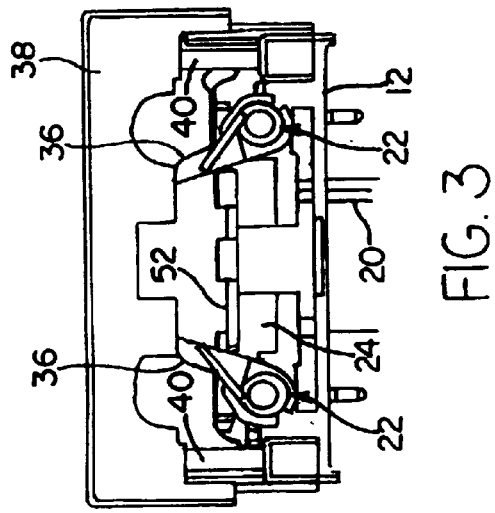
FIG. 3 is a side view of the socket with top in its raised or spring biased position.

Journaled about each of the cam shafts 22 is a latch 28. Each latch 28 is normally urged or biased by a helical spring 30 into a lower position adjacently overlying plate 24. Latches 28 are held in position by circling a sufficient portion of its accommodating cam shaft 22 so as to prevent lateral separation of the latch from the cam shaft. A coil spring 32 extends about each of the protruding ends 34 of each cam shaft 22 and is secured between base 12 and the cam shaft so as to normally urge or bias the cam shaft into a first position in which arms 36 located at the end portions of the cam shaft are elevated as best seen in FIG. 3.

Figure 8:
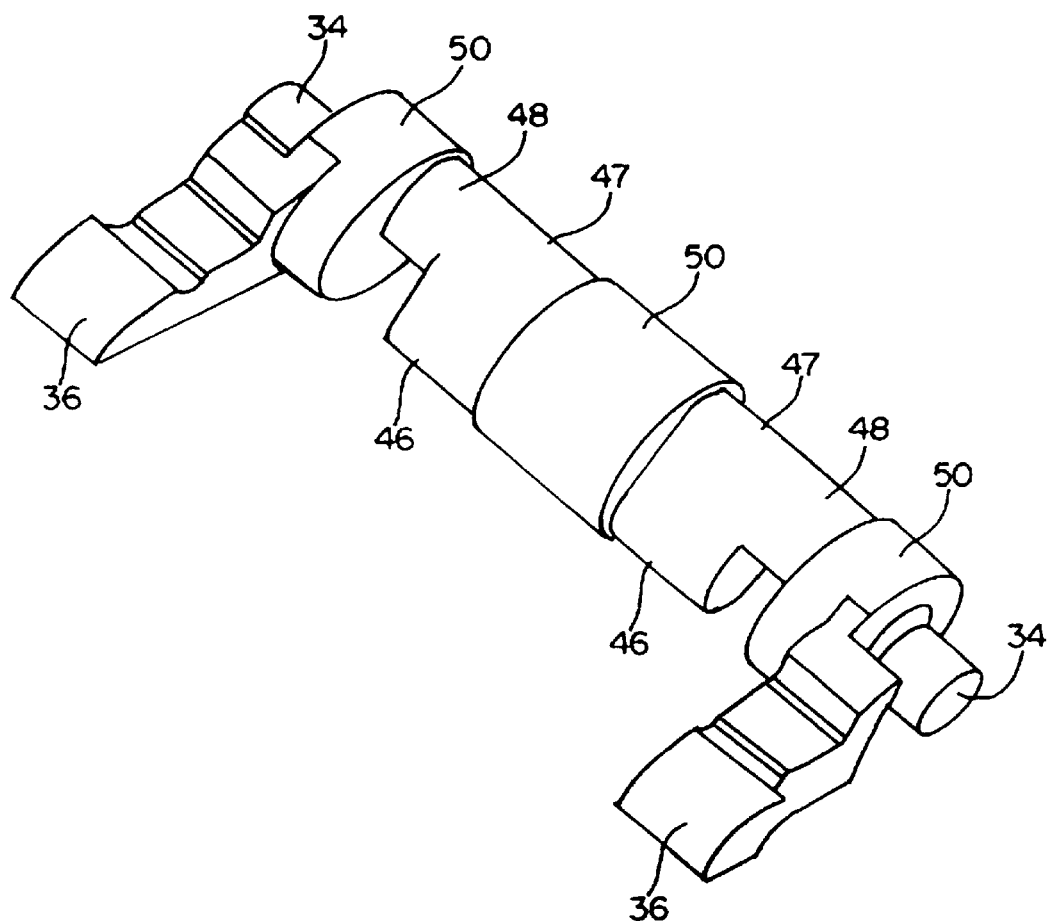
FIG. 8 is a perspective view of the cam shaft utilized in the socket.
Figure 15:
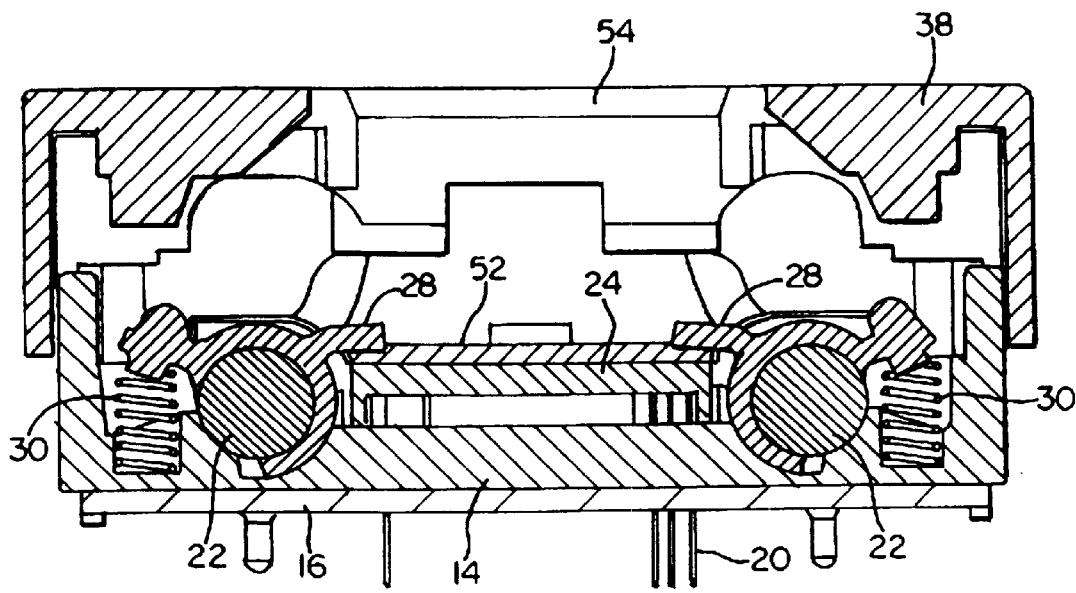
FIG. 15 is longitudinal cross-sectional view of the socket taken through the IC hold down latches with the top in a raised position.

A top or actuator 38 is mounted by guide pins 40 to upper base part 14 and is shiftable between upper and lower positions relative to base 12. Pins 40 each include an enlarged head 42 which abuts a shoulder within bore 44 at each corner of top 38 thereby preventing separation of the top from the base with the lower end of each guide 40 anchored within base 12. Top 38 abuts and is always in contact with arms 36 of cam shafts 22 with the arms serving to urge the top normally into the upper position as seen in FIGS. 3 and 15. When top 38 is depressed or moved towards base 12, it causes each of the cam shafts 22 to pivot within the base. Each cam shaft 22 includes a pair of drive lobes 46, 47 and a pair of return lobes 48. (FIG. 8)

Figure 4:
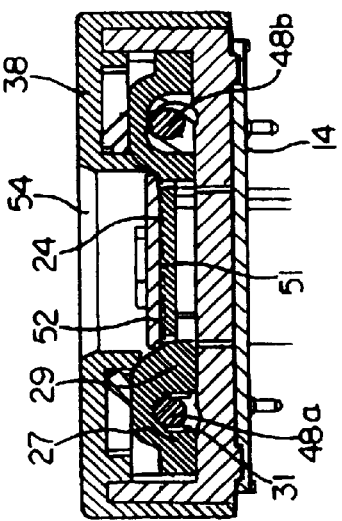
FIG. 4 is a cross-sectional side view of the socket through the driving cam lobes with the top in the lowered position.
Figure 5:
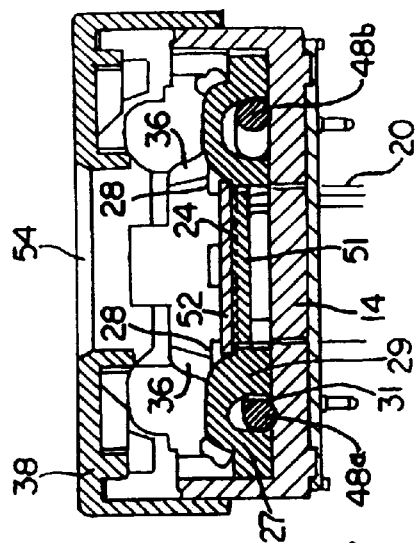
FIG. 5 is cross-sectional side view of the socket through the driving cam lobes with the top in the raised position.
Figure 2:
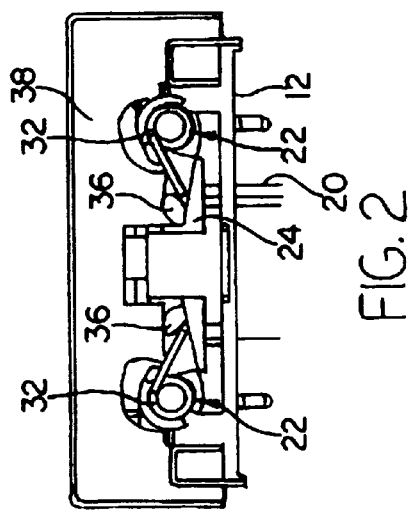
FIG. 2 is a side view of the socket with top depressed or in its lowered position.
Figure 13:
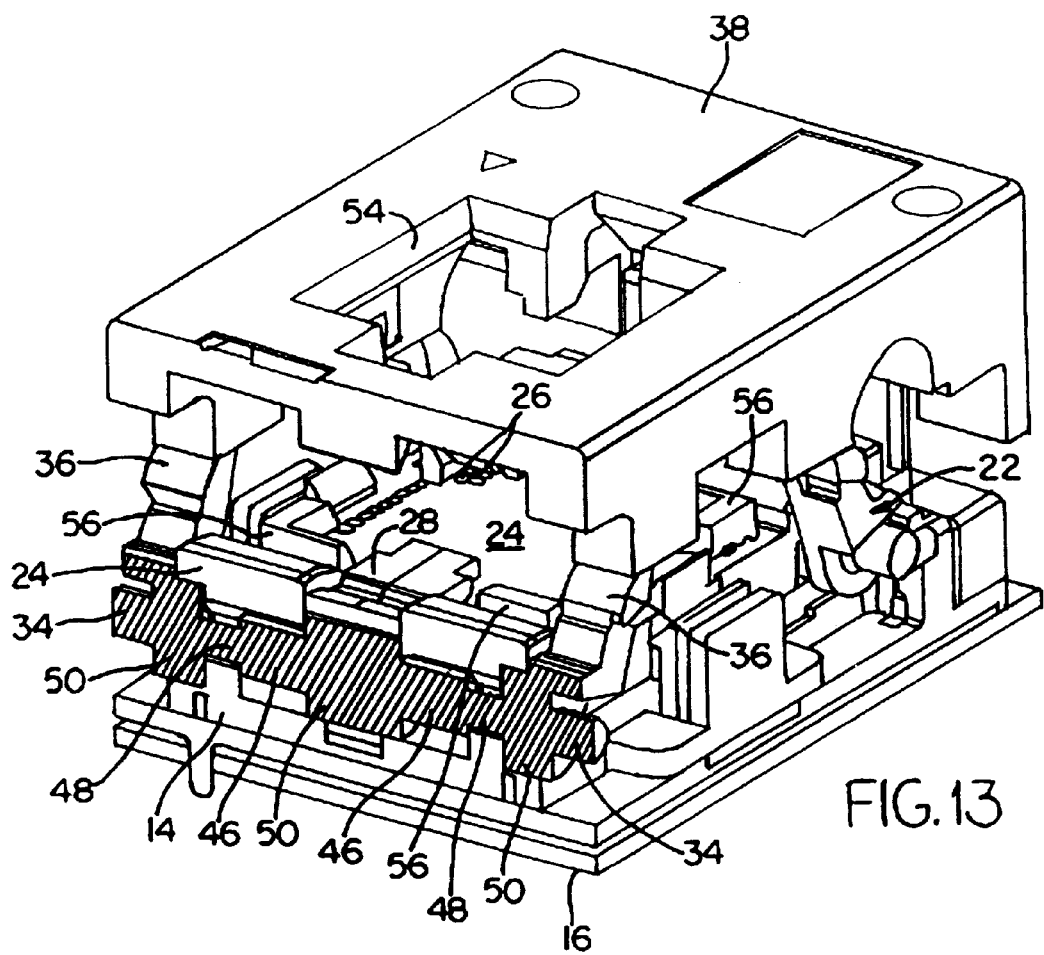
FIG. 13 is a perspective view of the socket device in partial form showing a vertical cross-sectional view taken through the center of one of the cam shafts and with the top in its raised position.
Figure 14:
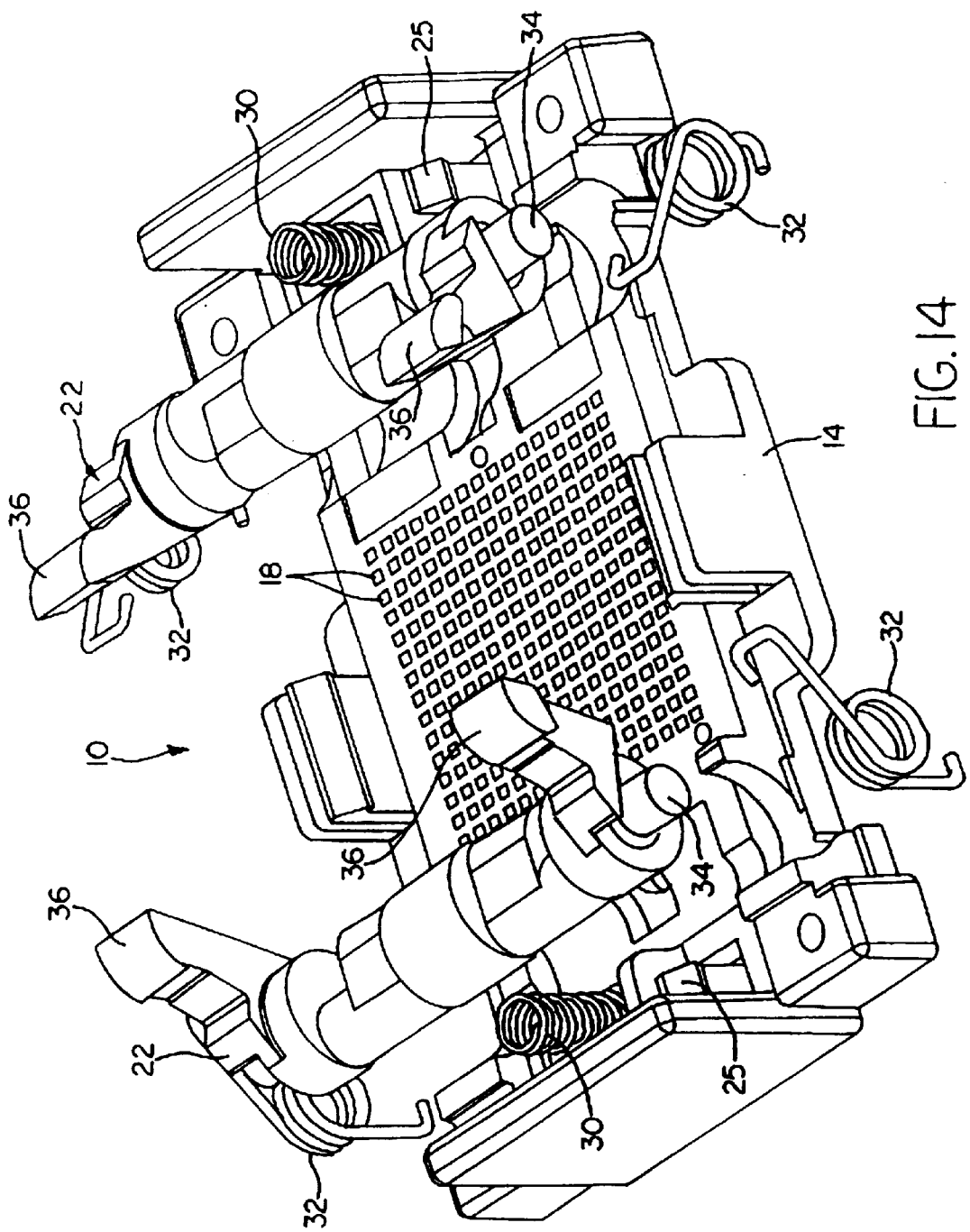
FIG. 14 is a perspective view of the upper portion of the base and cam shafts shown in separative or exploded form for illustrative purposes.

The operation of socket 10 is as follows: top 38 is depressed into its lowered position as shown in FIG. 2. In this position, plate 24 is centered with its openings 26 aligned with openings 18 in upper base part 14. Drive lobes 46 of the cam shafts 22 are positioned in a non-driving essentially diagonal position under plate 24 as seen in FIG. 4. The cam shafts are supported by circular shaped bearing parts 50 upon upper base part 14. While top 38 is in its lowered position an IC or chip 52 is deposited through a center opening 54 in the top and guidably positioned upon plate 24 by locating tabs 56 (FIGS. 9 and 13). Locating tabs 56 are positioned at each of the four corners of the opening grid in plate 24 and have beveled inside faces 58 which serve to guide the corners of the IC as it is lowered into position over the plate. Each locating tab 56 includes depending feet 60 (FIGS. 10 and 11) which are inserted into selected openings 26 in the plate depending upon the overall dimensions of the IC being accommodated by socket 10. Feet 60 of each tab 56 form snaps which, when the feet are inserted into openings 26, are snap fitted about a bottom surface of the plate so as to lock the tabs in position. The matter in which tabs 56 are removably secured to the plate in openings 26 can vary.

Figure 16:
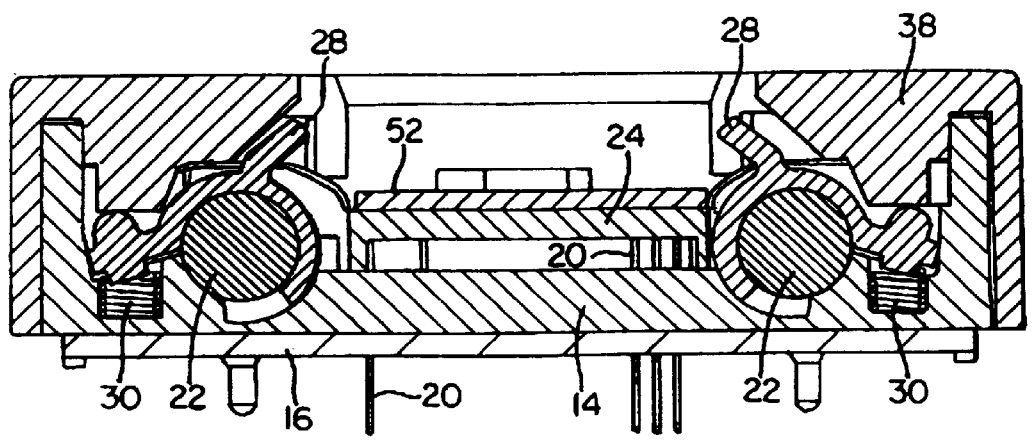
FIG. 16 is a longitudinal cross-sectional view of the socket taken through the IC hold down latches with the top in a lowered position showing the latches raised to free the IC from the socket device.

Located on the bottom surface of IC 52 are ball grid array leads 51. With IC 52 so located upon plate 24, leads 51 will seat themselves within openings 26 in the plate. During the locating of IC 52, latches 28 are in their raised position. As top 38 is permitted to rise under the spring biased upward movement of arms 36 of cam shafts 22, latches 28 which had been held in their raised position by the lid as shown in FIG. 16 are allowed to pivot inwardly under the influence of springs 30 to overly and retain the IC within socket 10 against plate 24. Upon the continued upward movement of top 38, cam shafts 22 rotate with their driving lobes 46 and 47 drivingly contacting plate 24 to urge the plate laterally or horizontally across plate 24 as best observed in FIG. 5. As moving from FIG. 4 to FIG. 5, the rotational movement of the left located cam shaft 22 is counter-clockwise causing lobe 47 to urge plate 24 laterally to the left and the rotational movement of the right located cam shaft is clockwise causing lobe 46 to also urge plate 24 laterally to the left. The combined effort of both cam shafts through their drive lobes 46 and 47 apply a shared force to the plate to shift plate 24 relative to base 12. As plate 24 and its carried IC 52 are shifted slightly laterally relative to base 12, the pins or conductors 20 extending into openings 26 in the plate adjacent the leads 51 of the IC are moved forcibly into engagement with the IC leads in a manner known in the prior art and as particularly described in U.S. Pat. No. 5,646,447, which is incorporated herein by reference. With IC 52 now so located within socket 10, the testing of the IC may proceed or the IC, when appropriately secured to a mounting board, can perform its operational function.

Figure 6:
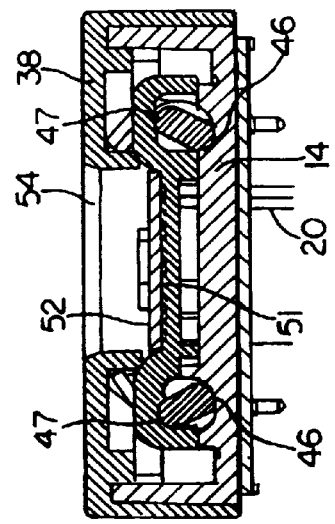
FIG. 6 is cross-sectional side view of the socket taken through the return cam lobes with the top in the lowered position.
Figure 7:
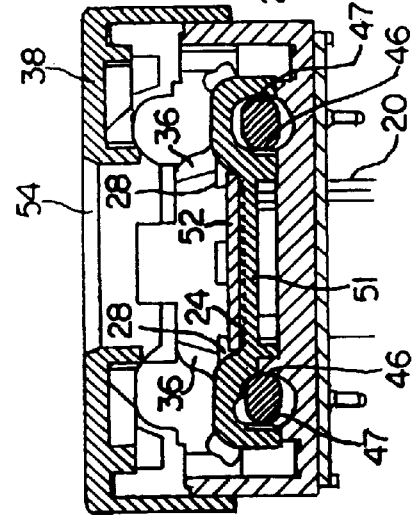
FIG. 7 is a cross-sectional side view of the socket taken through the return cam lobes with the top in the raised position.

To remove IC 52 from socket 10, top 38 is depressed or located in its lowered position as shown in FIGS. 2, 4, 6 and 16. As lid 38 is being depressed, cam shafts 22 due to their engagement through arms 36 with the lid are rotated causing their driving lobes 46, 47 to release their hold upon plate 24. To relocate plate 24 relative to base 12, as the lid is being lowered, the eccentrically positioned return lobes 48 are each rotated from the position illustrated in FIG. 7 into the position shown in FIG. 6. In viewing the return lobes in FIGS. 6 and 7, the lobes located to the left, designated 48(*a*), rotate clockwise contacting bearing tab 31 on wall like structure 29 thereby driving plate 24 to the right relative to upper base part 14 and to its original centered position seen in FIG. 6. As plate 24 is moved into its original or centered position relative to the socket, the latches 28 still initially overlap the IC allowing the IC to be shifted with the plate which causes conductors or pins 20 to be released from forcible engagement with the leads of the IC. Further downward movement of the top toward the base causes the top to engage latches 28 to rotate the latches into a raised position so as to release the IC for removal from socket 10 as seen in FIG. 16. Return lobes 48(*b*) as seen in FIGS. 6 and 7 freely rotate within plate 24 and produce no driving engagement with the plate. Driving lobes 48(*b*) exist only because cam shafts 22, for simplicity of manufacture, are of like construction and may be interchangeable. With top 38 fully depressed or in its lowered position relative to base 12, IC 52 may now be removed and another IC placed and centered upon plate 24.

Cam shafts 22 operate independently so as to produce even wear upon both cam shafts. To further reduce wear, bearing tabs such as tab 31 may be placed on all bearing surfaces. The cam shafts are identical so as to reduce manufacturing costs. In utilizing both cam shafts to initially shift plate 24, the applying load is distributed to both the fore and aft of the plate, thus reducing wear. Plate 24 is returned to its initial, loading position relative to base 12 by a single cam shaft with the load or pressure required to return the plate being reduced through the assistance of the flexed conductors or pins 20 which are in engagement with the leads of the IC.

It is to be understood that the invention is not to be limited to the details above given but may be modified within the scope of the appended claims. For example, in the preferred embodiment, locating tabs 56 are identical and interchangeable for manufacturing and assembly efficiency; however, non-uniform tabs or sized IC template could be used with the disclosed socket.

What I claim is:

1. A chip carrier socket for interconnecting a chip to a printed circuit board, said chip carrier socket comprising a base, a plurality of contacts extending from said base, an actuator, an urging means to urge leads of said chip into electrical engagement with said contacts, and a latching mechanism for releasably holding said chip upon said socket, whereby both the urging means and the latching mechanism are operated by said actuator, said urging means including double cam shafts, said urging means being partly defined by a plate having a plurality of openings therethrough aligned with said contacts, said plate being movable between a first position allowing entry of said leads into said openings, and a second position urging the leads against said contacts.

2. The chip carrier socket of claim 1, wherein said double cam shafts are identical and flank said plate.

3. A chip carrier socket for interconnecting a chip having leads to a printed circuit board, said chip carrier socket comprising a base, a plurality of contacts extending from said base, a plate movable between first and second positions, said first position allowing entry of said leads adjacent said contacts and said second position urging said leads into engagement with said contacts, an urging mechanism which urges said plate to said first and second positions, a latching mechanism, said latching mechanism journaled about said urging mechanism, and adjustable locating tabs for locating the chip on the socket wherein the locating tabs can be adjusted to accommodate chips of varying size and shape, said plate having openings for allowing entry of said leads and said tabs have feet sized to be retained within said openings for locating said tabs on said plate.

4. The chip carrier socket of claim 3 wherein said urging mechanism is comprised of double cam shafts.

5. The chip carrier socket of claims 4, wherein said double cam shafts are identical.

6. The chip carrier socket of claim 4, wherein both of said cam shafts urge said plate into the said second position and, only one of said cam shafts urge said plate into the said first position.

7. The chip carrier socket of claim 4, further comprising an actuator member to actuate said double cam shafts.

8. The chip carrier socket of claim 4, wherein said double cam shafts rotate in directions opposite from one another when actuated by said actuator.

9. The chip carrier socket of claim 8, wherein said actuator member is partly defined by a top to of the socket.

10. The chip carrier socket of claim 9, wherein the top is movable between upper and lower positions relative to said base such that when the top is moved to the upper position the leads are urged against the contacts and when the top is moved to the lower position the leads are disengaged from the contacts.

11. The chip carrier socket of claim 10, further comprising a biasing means for biasing said top in the upper position.

12. The chip carrier socket of claim 3 further comprising biasing mechanism for biasing the latching mechanism to hold said chip.

13. The chip carrier socket of claim 3 wherein each locating tab is identical to all other locating tabs.

14. The chip carrier socket of claim 13, wherein the locating tabs have chamfered surfaces to facilitate placement of the chip upon said plate.

15. The chip carrier socket 3, wherein the locating tabs are attached to the plate.

16. The chip carrier socket of claim 3, wherein the chip leads are in the form of a ball grid array.

17. A chip carrier socket for interconnecting a chip having leads to a printed circuit board, said ship carrier socket comprising a base, a plurality of contacts extending from said base, a plate movable between first and second positions said first position allowing entry of said leads adjacent said contact and said second position urging said leads into engagement with said contacts, an urging mechanism which urges said plate member to said first and second position, said urging mechanism including first and second cam shafts each having multiple lobes wherein at least one of said lobes on each cam shaft is a drive lobe and at least one other lobe of each cam shaft is a return lobe, said drive lobes of both said cam shafts urge said plate into said second position, and the return lobe on only one of said cam shafts urges said plate into said first position.

18. The chip carrier socket of claim 17, wherein said cam shafts include a bearing part for supporting said cam shafts for rotation upon said base part.

19. The chip carrier socket of claim 1, further comprising an actuating member to actuate said cam shafts, and said cam shafts further including arms engagable with and biased against said actuator.

20. The chip carrier socket of claim 19, wherein said plate has wall-like sections that engage said cam lobes.

21. The chip carrier socket of claim 20, further comprising a metal tab fit over at least one of said wall-like sections.

22. The chip carrier socket of claim 1, further comprising a latching mechanism journaled about said bearing part.

* * * * *

UNITED STATES PATENT AND TRADEMARK OFFICE
CERTIFICATE OF CORRECTION

PATENT NO.   : 6,368,137 B1  
DATED        : April 9, 2002  
INVENTOR(S)  : Erik G. Orwoll It is certified that error appears in the above-identified patent and that said Letters Patent is hereby corrected as shown below:

Column 5,
Line 45, delete "claims" and insert -- claim --

Column 6,
Line 20, insert after "socket" -- of claim --
Line 26, delete "ship" and insert -- chip --

Signed and Sealed this

Eighteenth Day of June, 2002

*Attest:*

*Attesting Officer*

JAMES E. ROGAN  
*Director of the United States Patent and Trademark Office*